(12) United States Patent
Shoki

(10) Patent No.: US 6,366,640 B1
(45) Date of Patent: Apr. 2, 2002

(54) X-RAY MASK BLANK, X-RAY MASK AND METHOD FOR MANUFACTURING THE SAME

(75) Inventor: Tsutomu Shoki, Tama (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 09/439,549

(22) Filed: Nov. 12, 1999

(30) Foreign Application Priority Data

Nov. 14, 1998 (JP) .......................................... 10-341058

(51) Int. Cl.[7] ................................................. G21K 5/00
(52) U.S. Cl. .............................................. 378/35; 430/5
(58) Field of Search .......................... 378/35, 34; 430/5

(56) References Cited

U.S. PATENT DOCUMENTS 5,958,627 A * 9/1999 Shoki ............................. 430/5
5,999,590 A * 12/1999 Shoki et al. ................... 378/35
6,128,363 A * 10/2000 Shoki et al. ................... 378/35

FOREIGN PATENT DOCUMENTS

JP 10-135130 * 5/1998 ......... H01L/21/027

* cited by examiner

Primary Examiner—David P. Porta
Assistant Examiner—Pamela R. Hobden
(74) Attorney, Agent, or Firm—Cook, Alex, McFarron, Manzo, Cummings & Mehler, Ltd.

(57) ABSTRACT

There is disclosed an X-ray mask comprising, on a support substrate 11*a*, an X-ray transmission film 12 for transmitting X-rays and an X-ray absorber pattern 13*a* formed on the X-ray transmission film 12 for absorbing the X-rays. The X-ray absorber pattern 13*a* is formed of a material which contains tantalum, boron, nitrogen and/or oxygen.

11 Claims, 2 Drawing Sheets

X-RAY MASK BLANK, X-RAY MASK AND METHOD FOR MANUFACTURING THE SAME

REFERENCE OF RELATED APPLICATION

This application claims the priority right under 35 U.S.C. 119 of Japanese Patent Application No. Hei 10-341058 filed on Nov. 14, 1998, the entire disclosure of which is incorporated by reference.

BACKGROUND OF THE INVENTION (1) Field of the Invention

The present invention relates to an X-ray mask blank and a method for manufacturing the same, and an X-ray mask and a method for manufacturing the same.

(2) Description of the Related Art

In the semiconductor industry, as a conventional transfer technique of a fine pattern necessary for preparing an integrated circuit formed of the fine pattern on a silicon substrate, and the like, a photolithography method of using visible or ultraviolet rays as exposure electromagnetic waves to transfer the fine pattern has been used.

In recent years, however, with a progress of semiconductor technique, high integration of semiconductor devices such as an ultra LSI has remarkably progressed, and there arises a demand for a transfer technique of the fine pattern with high precision which exceeds a transfer limit in the visible or ultraviolet rays used in the conventional photolithography method.

In order to realize the transfer of such fine pattern, the development and practical application of an X-ray lithography method using X-rays shorter in wavelength than the visible or ultraviolet rays have been advanced.

X-ray lithography is an equal-size vicinity exposure, and requires an equal-size X-ray mask. The structure of the X-ray mask for use in the X-ray lithography is shown in FIG. 1.

As shown in FIG. 1, an X-ray mask 1 is constituted of an X-ray transmission film (membrane) 12 for transmitting X-rays, and an X-ray absorber pattern 13a for absorbing the X-rays, which are supported by a support substrate (support frame) 11a formed of silicon. Furthermore, to facilitate the reinforcing and handling, a glass frame 15 having a larger outer diameter than that of the support substrate is bonded to the support substrate. Here, for example, the support substrate with an outer diameter of four inches, and the glass frame with an outer diameter of five inches are used.

A process of preparing an X-ray mask blank to obtain the X-ray mask is shown in FIG. 2.

First, the X-ray transmission film 12 with a thickness of about 2 μm is formed on both surfaces of a silicon substrate 11 by CVD method, and subsequently an X-ray absorbing film 13 and an etching mask layer 14 are successively formed on the X-ray transmission film 12 by a sputtering method (FIG. 2a).

Subsequently, an area to form a mask area is removed from the X-ray transmission film (not shown) formed on the back surface of the substrate by dry etching, the X-ray transmission film remaining on an outer peripheral portion is used as a mask to wet-etch the central portion of the back surface of the silicon substrate by hydrofluoric nitrate (mixed solution of hydrofluoric acid and nitric acid) until the back surface of the X-ray transmission film 12 is exposed, and the X-ray transmission film 12 is self-supported (formed into a membrane) (FIG. 2b).

Next, the reinforcing glass frame 15 is bonded by a method such as anodic bonding (FIG. 2c).

As the X-ray transmission film 12, silicon carbide or another material which has a high Young's modulus and a superior resistance against X-ray radiation is generally used. As the X-ray absorbing film 13, a material containing tantalum (Ta), tungsten (W), and the like which has a high X-ray absorbing ratio and a superior resistance against X-ray radiation is well used.

In recent years, with the progress of the photolithography technique, the time to introduce the X-ray lithography is fed forward, and in the present situation, the lithography is expected to be introduced from the generation of 1 Gbit-DRAM (design rule: 0.18 μm). Even if the X-ray lithography is introduced from 1 G, it can be used over a plurality of generations of 4 G. 16 G, 64 G. As the generation advances, strict prescribed properties are required.

Particularly, the X-ray absorbing film is requested to have a high X-ray absorbing ratio, to have a dense crystalline structure to provide an excellent dry etching property and form smooth pattern side walls and upper face, to be able to form a pattern of 0.18 μm or less and enhance the dimensional precision of the pattern, to have a low stress and no stress nonuniformity, to have no pattern strain or positional fluctuation caused by the stress or stress change and be superior in positional precision, to be superior in X-ray radiation resistance, and to have other strict prescribed properties.

For the positional precision required for the X-ray mask, for example, when the use in 64 G is assumed, the precision becomes stricter, and a high positional precision of 10 nm is necessary. Therefore, the strain attributed to the film stress needs to be as close to zero as possible. Particularly, it is important to minimize the pattern strain attributed to the stress of the X-ray absorbing film. The X-ray absorbing film needs to have an excessively low stress, and to be uniform in a mask area. For example, in the X-ray absorbing film with a thickness of 0.5 μm, a stress of ±10 MPa or less is required in the mask area of 30 mm square.

Additionally, the stress of the prepared film has to be unchanged and maintained even after the pattern is formed to prepare the mask. If the stress of the film forming the pattern changes, the pattern strain is caused after preparing the mask, which raises a problem.

SUMMARY OF THE INVENTION

The present invention has been developed under the above-described background, and a first object thereof is to provide an X-ray mask blank from which an X-ray mask satisfying strict prescribed properties requested for X-ray masks of 1 Gbit-DRAM and subsequent generations can be manufactured, a method for manufacturing the blank, a method for manufacturing the X-ray mask, and the like.

Another object is to provide an X-ray mask which satisfies strict prescribed properties requested for X-ray masks of 1 Gbit-DRAM and subsequent generations, and particularly a second object is to provide an X-ray mask which has no pattern strain or no positional fluctuation attributed to a change of film stress of an X-ray absorber pattern after preparing the mask and which is superior in positional precision.

To achieve the above-described objects, as a result of intensive researches, the present inventors have found that an X-ray absorbing film containing tantalum (Ta), boron (B), nitrogen and/or oxygen has a high X-ray absorbing ratio, has a dense crystalline structure to provide an excellent dry etching property and form smooth pattern side walls and upper face, can form a pattern of 0.18 μm or less to enhance a pattern dimensional precision, has a low stress and no stress nonuniformity, has no pattern strain or no positional fluctuation attributed to the stress and stress change to provide a superior positional precision, is superior in X-ray radiation resistance, and satisfies strict prescribed properties required for X-ray masks of 1 Gbit-DRAM and subsequent generations.

Specifically, the present invention is constituted as follows:

(Constitution 1) An X-ray mask blank comprising, on a mask substrate, an X-ray transmission film for transmitting X-rays and an X-ray absorbing film formed on the X-ray transmission film for absorbing the X-rays, the X-ray absorbing film containing tantalum, boron and nitrogen.

(Constitution 2) An X-ray mask blank comprising, on a mask substrate, an X-ray transmission film for transmitting X-rays and an X-ray absorbing film formed on the X-ray transmission film for absorbing the X-rays, the X-ray absorbing film containing tantalum, boron and oxygen.

(Constitution 3) An X-ray mask blank comprising, on a mask substrate, an X-ray transmission film for transmitting X-rays and an X-ray absorbing film formed on the X-ray transmission film for absorbing the X-rays, the X-ray absorbing film containing tantalum, boron, nitrogen and oxygen.

(Constitution 4) A method for manufacturing an X-ray mask blank, comprising steps of forming an X-ray transmission film on a mask substrate, and forming an X-ray absorbing film on the X-ray transmission film, the step of forming the X-ray absorbing film comprising steps of using a target containing tantalum and boron, and adding gas containing nitrogen and/or gas containing oxygen to sputtering gas to form the X-ray absorbing film.

(Constitution 5) An X-ray mask comprising, on a support substrate, an X-ray transmission film for transmitting X-rays and an X-ray absorber pattern formed on the X-ray transmission film for absorbing the X-rays, the X-ray absorber pattern comprising a material containing tantalum, boron, nitrogen and/or oxygen.

In the present invention the X-ray absorbing film containing tantalum (Ta), boron (B), nitrogen and/or oxygen has a: high X-ray absorbing ratio, has a dense crystalline structure to provide an excellent dry etching property and form smooth pattern side walls and upper face, can form a pattern of 0.18 μm or less to enhance a pattern dimensional precision, has a low stress and no stress nonuniformity, has no pattern strain or no positional fluctuation attributed to the stress and stress change to be superior in positional precision, is further superior in X-ray radiation resistance, and satisfies strict prescribed properties required for the X-ray masks of 1 Gbit-DRAM and subsequent generations.

Particularly, when the X-ray absorbing film is dry-etched to form the X-ray absorber pattern, the pattern side face is exposed as a new face of the X-ray absorbing film, but in the X-ray absorbing film containing tantalum (Ta), boron (B), nitrogen and/or oxygen, the pattern side face is not substantially oxidized in atmosphere even after the X-ray absorber pattern is formed, so that the change of the film stress of the X-ray absorber pattern by the oxidation of the pattern side face can be minimized. Therefore, the film has no pattern strain or no positional fluctuation attributed to the stress change after the formation of the X-ray absorber pattern, and is superior in positional precision. On the other hand, when the X-ray absorbing film is formed of pure metals such as Ta, W, or alloys mainly containing Ta or W, the pattern side face is oxidized in the atmosphere after the formation of the X-ray absorber pattern, so that the formed oxide film easily generates the film stress change of the X-ray absorber pattern and the stress change amount is large. Moreover, even in the compound of Ta and B, the stress change of about 5 MPa is generated by the surface oxidation, and the mask having a design rule of 0.18 μm is strained by 30 nm at maximum.

Moreover, the X-ray absorbing film containing tantalum (Ta), boron (B), nitrogen and/or oxygen generates no stress change even during cleaning using the mixed solution of sulfuric acid and aqueous hydrogen peroxide, and the like. Therefore, the film has no pattern strain or no positional fluctuation attributed to the stress change after the pattern formation and is superior in positional precision.

Furthermore, the X-ray absorbing film containing tantalum (Ta), boron (B), nitrogen and/or oxygen has a high X-ray absorbing ratio and a dense crystalline structure, so that the dry etching property is excellent and the pattern side walls and upper face are smooth. Additionally, the film can form a pattern of 0.18 μm or less to enhance the pattern dimensional precision, and has a low stress and no stress nonuniformity.

Additionally, the present invention is suitable for the manufacture of the X-ray masks of 1 Gbit-DRAM and subsequent generations, and also suitable for the manufacture of the X-ray masks of 4 Gbit-DRAM (design rule of 0.13 μm) and subsequent generations.

DETAILED DESCRIPTION OF THE PREFERRED EMBODIMENTS

Figure 1:
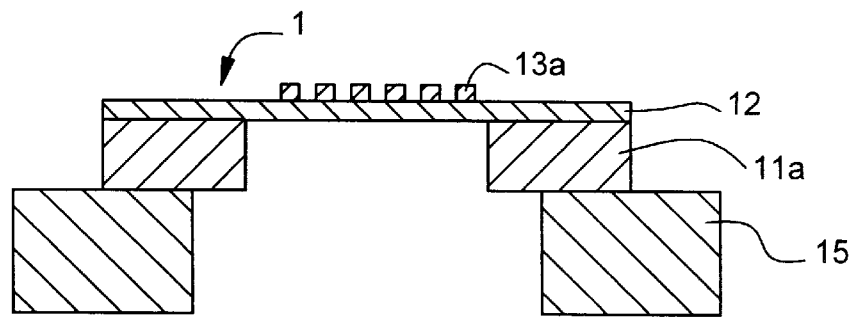
FIG. 1 is a sectional view showing the structure of an X-ray mask.
Figure 2A:
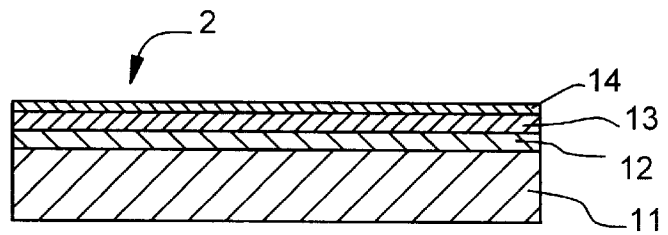
FIGS. 2a to 2c are sectional views showing a preparation process of an X-ray mask blank.
Figure 2B:
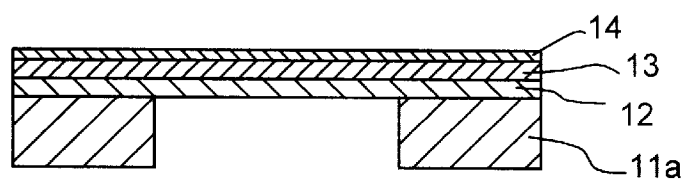
Figure 2C:
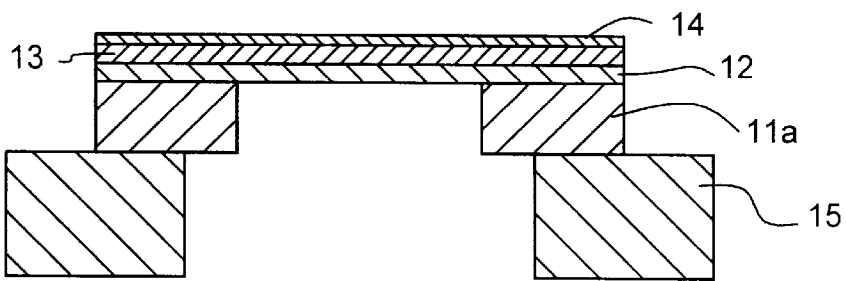

First, an X-ray mask blank of the present invention will be described.

The X-ray mask blank of the present invention comprises, on a mask substrate, an X-ray transmission film for transmitting X-rays, and an X-ray absorbing film formed on the X-ray transmission film for absorbing the X-rays.

Here, a silicon substrate (silicon wafer) is frequently used as the mask substrate, but this is not limited, and known substrates such as quartz glass can be used.

Examples of the X-ray transmission film include SiC, SiN, a diamond thin film, and the like, and SiC is preferable from the standpoint of X-ray radiation resistance or the like.

The film stress of the X-ray transmission film is preferably in the range of 50 to 400 MPa. Moreover, the thickness of the X-ray transmission film is preferably in the range of about 1 to 3 μm.

The present invention is characterized in that the X-ray absorbing film contains tantalum (Ta), boron (B), nitrogen (N) and/or oxygen (O).

The X-ray absorbing film containing Ta, B, N and/or O has a small internal stress, a high purity to contain no impurities, a high X-ray absorbing ratio, a superior X-ray radiation resistance, and other advantages. Moreover, by controlling the gas pressure and charge power during the film formation by sputtering, the internal stress can easily be controlled.

The X-ray absorbing film containing Ta, B, N and/or O preferably has an amorphous structure or crystallite structure. This is because in the crystalline (columnar) structure a processing of 0.18 μm or less is difficult, and the X-ray radiation resistance and stability with an elapse of time are deteriorated. Additionally, by adding N and/or O to Ta and B and regulating the amount, surface oxidation can be suppressed while maintaining the amorphous structure. Therefore, the compatibility of the pattern dimensional precision and the pattern positional precision after the pattern formation can be realized.

The preferable composition of the X-ray absorbing film containing Ta, B, N and/or O differs with desired film characteristics (film density, and the like) and cannot absolutely be defined, but for example, in the X-ray absorbing film containing Ta, B and N, the contents of components in the film are preferably Ta:B:N=about 65 to 80 atomic %:5 to 18 atomic %:2 to 25 atomic %.

When the X-ray absorbing film contains Ta, B and O, for example, the contents of components in the film are preferably Ta:B:O=about 65 to 80 atomic %:5 to 18 atomic %:2 to 25 atomic %.

When the X-ray absorbing film contains Ta, B, N and O, for example, the contents of components in the film are preferably Ta:B:N:O=about 65 to 80 atomic %:5 to 18 atomic %:1 to 15 atomic %:1 to 15 atomic %.

When the proportion of Ta and B in the X-ray absorbing film exceeds the above-described range, the particle diameter of the crystallite is increased, and it becomes difficult to perform a fine processing of 0.18 μm or less. Moreover, when the proportion of N, O in the X-ray absorbing film exceeds the above-described range, the X-ray absorbing ratio and etching property are deteriorated.

For Ta and B in the X-ray absorbing film containing Ta, B, N and/or O, for example, the compound of Ta and B [e.g., $Ta_4B$ (Ta:B=8:2), or tantalum boride having the composition other than $Ta_4B$] can be used.

Moreover, the X-ray absorbing film containing Ta, B, N and/or O may contain Si, Ge, Ti, W, Re, and other components in a range in which the effect of the present invention is not deteriorated.

The stress of the X-ray absorbing film is preferably ±10 MPa or less. Moreover, the thickness of the X-ray absorbing film is preferably in the range of about 0.3 to 0.8 μm.

Additionally, the X-ray mask blank of the present invention can be provided with layers (films) other than the X-ray transmission film and the X-ray absorbing film as occasion demands. For example, an etching stop layer, an adhesive layer, a reflection preventive layer, a conductive layer, and the like may be disposed between the X-ray transmission film and the X-ray absorbing film. Moreover, an etching mask layer, a protective layer, a conductive layer, and the like may be disposed on the X-ray absorbing film.

The positional strain of the X-ray mask is strongly influenced by the stress of the X-ray mask material, and high stresses of the X-ray absorbing film, the etching mask layer, the etching stop layer, and the like induce the positional strain. Therefore, each film constituting the X-ray mask needs to have an extremely low stress.

A material mainly containing chromium is used as the etching mask layer in the X-ray mask blank. Specifically, the etching mask layer formed of the material containing chromium, carbon and/or nitrogen can obtain the extremely low film stress while maintaining a high etching selection ratio with the X-ray absorbing film.

The film thickness of the etching mask layer is preferably in the range of about 0.03 to 0.1 μm. Moreover, the product of the film stress and the film thickness in the etching mask layer is preferably $\pm 1 \times 10^4$ dyn/cm or less. When the product of the film stress and the film thickness exceeds the above-described range, the positional strain by the stress is large, and the X-ray mask having an extremely high positional precision cannot be obtained.

A method for manufacturing the X-ray mask blank of the present invention will next be described.

In the method for manufacturing the X-ray mask blank of the present invention, in the process of forming the X-ray absorbing film, by using a target containing tantalum and boron, and adding the gas containing nitrogen and/or the gas containing oxygen to the sputtering gas, the X-ray absorbing film is formed.

Here, the stress of the X-ray absorbing film can be controlled by the adding amount of nitrogen and/or oxygen during sputtering, sputtering total pressure, DC charge power, and other sputtering conditions. Moreover, also by thermally treating the X-ray absorbing film after the film formation, the stress of the X-ray absorbing film can further be controlled.

As the target containing tantalum and boron, the compound target of tantalum and boron [e.g., $Ta_4B$ (Ta: B=8:2), tantalum boride having the composition other than $Ta_4B$, and other compounds] is preferable. Moreover, as the target composition, Ta:B=about 75 to 90 atomic %:10 to 25 atomic % is preferable.

Examples of the sputtering method Include RF magnetron sputtering, DC magnetron sputtering, DC sputtering and the like.

Examples of sputtering gas include argon, xenon, helium, and other inactive gases. Additionally, xenon is preferably used from the standpoint of the film properties of the X-ray absorbing film (uniformity, and the like).

Moreover, the other processes of manufacturing the X-ray mask blank are not especially limited, and the conventional known method for manufacturing the X-ray mask blank can be applied.

A method for manufacturing the X-ray mask of the present invention will next be described.

The method for manufacturing the X-ray mask of the present invention is characterized in that the X-ray mask blank of the present invention is used to manufacture the X-ray mask.

The process of manufacturing the X-ray mask is not especially limited, and the conventional known process of manufacturing the X-ray mask can be applied.

For example, during patterning of the etching mask layer, an electron ray resist is formed on the etching mask layer, and known patterning techniques such as an electron ray lithography method (drawing, developing, rinsing, drying, and the like) can be used. The film thickness of the resist is preferably in the range of 50 to 500 nm.

The mixed gas of chlorine and oxygen is preferably used as the etching gas when a resist pattern is used as the mask to dry-etch the etching mask layer.

Chlorine is preferably used as the etching gas when an etching mask pattern is used as the mask to dry-etch the X-ray absorbing film.

As a dry etching device, a reactive ion etching (RIE) device, a reactive ion beam etching (RIBE) device using high-density plasma sources such as ECR and ICP, and the like can be used.

When the central portion of the mask substrate is removed from the back surface and the support frame is formed to self-support the membrane, the back surface processing is preferably performed by wet etching from the standpoint of manufacturing efficiency. In this case, as the etching solution, the mixed solution of hydrofluoric acid and nitric acid, KOH, and the like can be used. The etching conditions can appropriately be adjusted.

Frames such as a glass frame can appropriately be bonded to the mask substrate or the X-ray mask. The time of the process of bonding the frame is not especially limited.

EXAMPLE

The present invention will be described hereinafter in more detail based on examples.

Example 1

FIG. 3 is an explanatory view of the process of manufacturing the X-ray mask blank according to one embodiment of the present invention. The method for manufacturing the X-ray mask blank will be described hereinafter with reference to FIG. 3, and the method for manufacturing the X-ray mask will further be described.

Figure 3A:
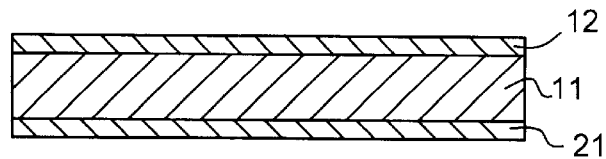
FIGS. 3a to 3d are sectional views showing a manufacture process of an X-ray mask blank according to one embodiment of the present invention.

First, silicon carbide films were formed as X-ray transmission films 12, 21 on both surfaces of the silicon (Si) substrate 11 (FIG. 3a). Additionally, a flat silicon substrate having a diameter of four inches, a thickness of 2 mm, and crystalline orientation (100) was used as the silicon substrate 11. Moreover, as the X-ray transmission film 12, silicon carbide was formed into a film having a thickness of 2 $\mu$m by the CVD method using dichlorosilane and acetylene. Furthermore, the surface of the silicon carbide film as the X-ray transmission film 12 was flatted by mechanical polishing, so that a surface roughness of Ra=1 nm or less was obtained.

Figure 3B:
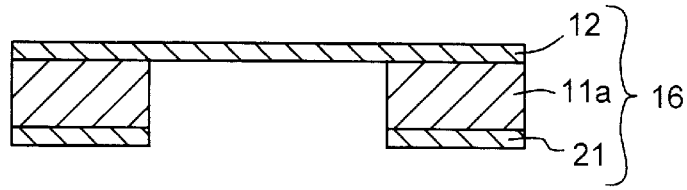

Subsequently, for the X-ray transmission film 21 formed on the back surface of the substrate 11, reactive ion etching was performed using the mixed gas of $CF_4$ and oxygen gas to etch/remove an area of 30 mm square in the central portion, then the X-ray transmission film 21 remaining in the back surface peripheral portion was used as the mask to perform immersion in the mixed solution of hydrofluoric acid and nitric acid (10:1), and the silicon of the back surface central portion was removed, so that a mask membrane 16 having the 30 mm square, self-supporting X-ray transmission film 12 (membrane) was formed (FIG. 3b).

Figure 3C:
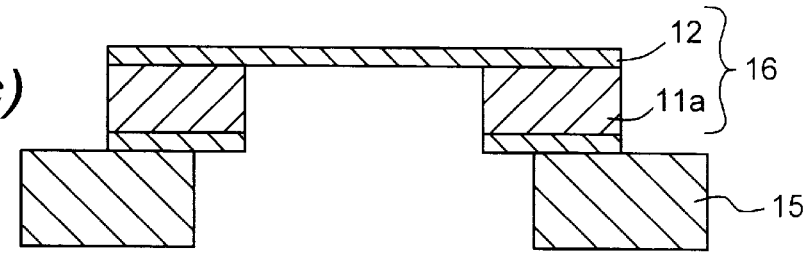

Subsequently, the glass frame 15 was bonded to the mask membrane 16 by the anodic bonding method (FIG. 3c). In this case, while the glass frame (pyrex glass) and the mask membrane overlapped each other, heating was performed to 320° C., and a direct-current voltage of 1 kV was applied for ten minutes using the glass frame side as a cathode and the mask membrane side as an anode to perform the anodic bonding.

Figure 3D:
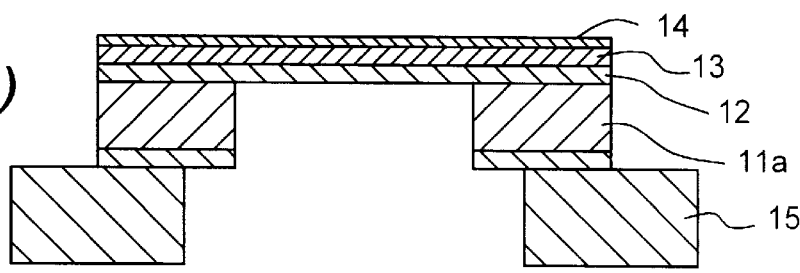

Next, on the X-ray transmission film 12 the target containing tantalum and boron (Ta:B=85:15 (atomic % ratio)) was used, the gas with 25% of nitrogen added to xenon was used as the sputtering gas, and the X-ray absorbing film 13 was formed into a thickness of 0.5 $\mu$m by DC magnetron sputtering method (FIG. 3d). In this case, the film stress of the X-ray absorbing film during the film formation was set to −200 MPa, the substrate with the X-ray absorbing film formed thereon was annealed/treated in the atmosphere at 250° C. for two hours to change the film stress in a tensile direction, and the X-ray absorbing film having a low stress of 10 MPa or less was obtained. The film composition of the X-ray absorbing film was Ta:B:N=78:12:10 (atomic % ratio).

Next on the X-ray absorbing film 13, a film containing chromium and nitrogen was formed as the etching mask layer 14 in a thickness of 0.05 $\mu$m by the DC magnetron sputtering method. Subsequently, the substrate was annealed/treated at 210° C. for two hours, so that the etching mask layer having a low stress of 100 MPa or less was obtained (FIG. 3d).

The X-ray mask blank obtained as described above was used to prepare an X-ray mask having a pattern for 1 Gbit-DRAM with a design rule of 0.18 $\mu$m.

The obtained X-ray mask was high in X-ray absorbing ratio, smooth in the X-ray absorber pattern side wall and upper face, superior in pattern dimensional precision, and superior in X-ray radiation resistance.

Moreover, as a result of evaluation of positional strain by a coordinate measuring unit, a required high positional precision of 22 nm (3$\sigma$) or less was confirmed. Furthermore, after the mask was left to stand in the atmosphere for 100 days, as a result of re-evaluation of the positional strain by the coordinate measuring unit, no change was found in the positional precision. Moreover, after cleaning was performed using the mixed solution of sulfuric acid and aqueous hydrogen peroxide, and the like, as a result of further evaluation of the positional strain by the coordinate measuring unit, no change was found in the positional precision.

Example 2

The method for manufacturing the X-ray mask blank according to a second example, and the method for manufacturing the X-ray mask will be described hereinafter. Additionally, since the process of manufacturing the X-ray mask blank of the second example is the same as that of the first example except film forming conditions, description will be provided with reference to FIG. 3.

First, the silicon carbide films were formed as the X-ray transmission films 12, 21 on both surfaces of the silicon (Si) substrate 11 (FIG. 3a). Additionally, the flat silicon substrate having a diameter of four inches, a thickness of 2 mm, and crystalline orientation (100) was used as the silicon substrate 11. Moreover, as the X-ray transmission film 12, silicon carbide was formed into a film having a thickness of 2 $\mu$m by the CVD method using dichlorosilane and acetylene. Furthermore, the surface of the silicon carbide film as the X-ray transmission film 12 was flatted by mechanical polishing, so that the surface roughness of Ra=1 nm or less was obtained.

Subsequently, for the X-ray transmission film 21 formed on the back surface of the substrate 11, the reactive ion etching was performed using the mixed gas of $CF_4$ and oxygen gas to etch/remove the area of 30 mm square, from the central portion, then the X-ray transmission film 21 remaining in the back surface peripheral portion was used as the mask to perform immersion in the mixed solution of hydrofluoric acid and nitric acid (10:1), and the silicon of the back surface central portion was removed, so that the mask membrane 16 having the 30 mm square, self-supporting X-ray transmission film 12 (membrane) was formed (FIG. 3b).

Subsequently, the glass frame 15 was bonded to the mask membrane 16 by the anodic bonding method (FIG. 3c). In this case, while the glass frame (pyrex glass) and the mask membrane overlapped each other, heating was performed to 320° C., and the direct-current voltage of 1 kV was applied for ten minutes using the glass frame side as a cathode and the mask membrane side as an anode to perform the anodic bonding.

Next, on the X-ray transmission film 12 the target containing tantalum and boron (Ta:B=85:15 (atomic % ratio)) was used, the gas with 25% of oxygen added to xenon was used as the sputtering gas, and the X-ray absorbing film 13 was formed into a thickness of 0.5 μm by the DC magnetron sputtering method (FIG. 3*d*). In this case, the film stress of the X-ray absorbing film during the film formation was set to −200 MPa, the substrate with the X-ray absorbing film formed thereon was annealed/treated in the atmosphere at 250° C. for two hours to change the film stress in the tensile direction, and the X-ray absorbing film having a low stress of 10 MPa or less was obtained. The film composition of the X-ray absorbing film was Ta:B:O=78:12:10 (atomic % ratio).

Next on the X-ray absorbing film 13, the film containing chromium and nitrogen was formed as the etching mask layer 14 in a thickness of 0.05 μm by the DC magnetron sputtering method. Subsequently, this substrate was annealed/treated at 210° C. for two hours, so that the etching mask layer having a low stress of 100 MPa or less was obtained (FIG. 3*d*).

The X-ray mask blank obtained as described above was used to prepare the X-ray mask having the pattern for 1 Gbit-DRAM with the design rule of 0.18 μm.

The obtained X-ray mask was high in X-ray absorbing ratio, smooth in the X-ray absorber pattern side wall and upper face, superior in pattern dimensional precision, and superior in X-ray radiation resistance.

Moreover, as a result of the evaluation of the positional strain by the coordinate measuring unit, the required high positional precision of 22 nm (3σ) or less was confirmed. Furthermore, after the mask was left to stand in the atmosphere for 100 days, as a result of the re-evaluation of the positional strain by the coordinate measuring unit, no change was found in the positional precision. Moreover, after the cleaning was performed using the mixed solution of sulfuric acid and aqueous hydrogen peroxide, and the like, as a result of further evaluation of the positional strain by the coordinate measuring unit, no change was found in the positional precision.

Example 3

The method for manufacturing the X-ray mask blank according to a third example, and the method for manufacturing the X-ray mask will be described hereinafter. Additionally, since the process of manufacturing the X-ray mask blank of the third example is the same as that of the first example except the film forming conditions, description will be provided with reference to FIG. 3.

First, the silicon carbide films were formed as the X-ray transmission films 12, 21 on both surfaces of the silicon (Si) substrate 11 (FIG. 3*a*). Additionally, the flat silicon substrate having a diameter of four inches, a thickness of 2 mm, and crystalline orientation (100) was used as the silicon substrate 11. Moreover, as the X-ray transmission film 12, silicon carbide was formed into a film having a thickness of 2 μm by the CVD method using dichlorosilane and acetylene. Furthermore, the surface of the silicon carbide film as the X-ray transmission film 12 was flatted by mechanical polishing, so that the surface roughness of Ra=1 nm or less was obtained.

Subsequently, for the X-ray transmission film 21 formed on the back surface of the substrate 11, the reactive ion etching was performed using the mixed gas of $CF_4$ and-oxygen gas to etch/remove the area of 30 mm square from the central portion, then the X-ray transmission film 21 remaining in the back surface peripheral portion was used as the mask to perform immersion in the mixed solution of hydrofluoric acid and nitric acid (10:1), and the silicon of the back surface central portion was removed, so that the mask membrane 16 having the 30 mm square, self-supporting X-ray transmission film 12 (membrane) was formed (FIG. 3*b*).

Subsequently, the glass frame 15 was bonded to the mask membrane 16 by the anodic bonding method (FIG. 3*c*). In this case, while the glass frame (pyrex glass) and the mask membrane overlapped each other, heating was performed to 320° C., and the direct-current voltage of 1 kV was applied for ten minutes using the glass frame side as a cathode and the mask membrane side as an anode to perform the anodic bonding.

Next, on the X-ray transmission film 12 the target containing tantalum and boron (Ta:B=85:15 (atomic % ratio)) was used, the gas with 10% of nitrogen and 10% of oxygen added to xenon was used as the sputtering gas, and the X-ray absorbing film 13 was formed into a thickness of 0.5 μm by the DC magnetron sputtering method (FIG. 3*d*). In this case, the film stress of the X-ray absorbing film during the film formation was set to −200 MPa, the substrate with the X-ray absorbing film formed thereon was annealed/treated in the atmosphere at 250° C. for two hours to change the film stress in the tensile direction, and the X-ray absorbing film having a low stress of 10 MPa or less was obtained. The film composition of the X-ray absorbing film was Ta:B:N:O= 79:13:4:4 (atomic % ratio).

Next on the X-ray absorbing film 13, the film containing chromium and nitrogen was formed as the etching mask layer 14 in a thickness of 0.05 μm by the DC magnetron sputtering method. Subsequently, this substrate was annealed/treated at 210° C. for two hours, so that the etching mask layer having a low stress of 100 MPa or less was obtained (FIG. 3*d*).

The X-ray mask blank obtained as described above was used to prepare the X-ray mask having the pattern for 1 Gbit-DRAM with the design rule of 0.18 μm.

The obtained X-ray mask was high in X-ray absorbing ratio, smooth in the X-ray absorber pattern side wall and upper face, superior in pattern dimensional precision, and superior in X-ray radiation resistance.

Moreover, as a result of the evaluation of the positional strain by the coordinate measuring unit, the required high positional precision of 22 nm (3σ) or less was confirmed. Furthermore, after the mask was left to stand in the atmosphere for 100 days, as a result of the re-evaluation of the positional strain by the coordinate measuring unit, no change was found in the positional precision. Moreover, after the cleaning was performed using the mixed solution of sulfuric acid and aqueous hydrogen peroxide, and the like, as a result of further evaluation of the positional strain by the coordinate measuring unit, no change was found in the positional precision.

Comparative Example

The X-ray mask blank and the X-ray mask were manufactured in the same manner as in the above-described examples, except in that in the process of forming the X-ray absorbing film 13 in the examples, no nitrogen or oxygen was added to the sputtering gas, and only xenon was used as the sputtering gas to form the X-ray absorbing film 13, and the positional precision of the X-ray mask was evaluated.

As a result, it has been found that the stress change of about 5 MPa occurs by natural oxidation of the side face of the X-ray absorber pattern after the X-ray mask is prepared, and that the mask with the design rule of 0.18 μm is strained by 30 nm at maximum.

Additionally, in the above-described examples and comparative example, the film stress was measured by a bulging method. In the bulging method the stress of the self-supporting film can be measured with good precision (J. Vac. Sci. Technol. B, Vol. 1, No. 4, Oct–Dec, 1983, P1364–1366).

The present invention has been described by illustrating the preferred examples, but is not limited to these examples.

For example, the composition of the X-ray absorbing film is not limited to that in the examples, and the proportion of Ta, B, N, O can be changed in the object range of the present invention.

Moreover, instead of using the target containing Ta and B, the target containing Ta is used, the sputtering gas of $B_2H_6$, N, O, and the like is used, then the X-ray absorbing film can be formed by the reactive sputtering. Alternatively, by using the target containing Ta, B, N and/or O, the X-ray absorbing film can be formed.

Furthermore, as the X-ray transmission film, instead of silicon carbide, silicon nitride, diamond film, and the like may be used.

Additionally, as the etching mask layer, instead of the chromium compound, alumina ($Al_2O_3$), $SiO_2$ film, and the like may be used.

Moreover, as the material of the glass frame, instead of pyrex glass, aluminosilicate glass, crystalline glass, and the like may be used, and in addition to the glass, ceramics such as SiC and alumina may also be used. The frame may be bonded by using adhesives such as epoxy resin, instead of the anodic bonding. The bonding of the frame may be performed after the X-ray absorbing film or the etching mask layer is formed.

As described above, according to the method for manufacturing the X-ray mask blank and X-ray mask of the present invention, the X-ray mask satisfying the strict prescribed properties required for the X-ray mask on and after 1 Gbit-DRAM can be manufactured.

Moreover, according to the method for manufacturing the X-ray mask blank of the present invention, the X-ray mask blank of the present invention can be realized. Additionally, by controlling the gas pressure, the stress can be controlled.

Furthermore, the X-ray mask of the present invention satisfies the strict prescribed properties required for the X-ray mask on and after 1 Gbit-DRAM. Particularly, the X-ray mask of the present invention has no pattern strain or no positional fluctuation attributed to the change of the film stress of the X-ray absorber pattern after preparing the mask, and is superior in positional precision.

What is claimed is:

1. An X-ray mask blank comprising, on a mask substrate, an X-ray transmission film for transmitting X-rays, and an X-ray absorbing film formed on the X-ray transmission film for absorbing the X-rays, wherein said X-ray absorbing film contains tantalum, boron and nitrogen.

2. An X-ray mask blank comprising, on a mask substrate, an X-ray transmission film for transmitting X-rays, and an X-ray absorbing film formed on the X-ray transmission film for absorbing the X-rays, wherein said X-ray absorbing film contains tantalum, boron and oxygen.

3. An X-ray mask blank comprising, on a mask substrate, an X-ray transmission film for transmitting X-rays, and an X-ray absorbing film formed on the X-ray transmission film for absorbing the X-rays, wherein said X-ray absorbing film contains tantalum, boron, nitrogen and oxygen.

4. A method for manufacturing an X-ray mask blank, comprising steps of forming an X-ray transmission film on a mask substrate, and forming an X-ray absorbing film on said X-ray transmission film, wherein said step of forming the X-ray absorbing film comprises steps of using a target containing tantalum and boron, and adding gas containing nitrogen and/or gas containing oxygen to sputtering gas to form the X-ray absorbing film.

5. An X-ray mask comprising, on a support substrate, an X-ray transmission film for transmitting X-rays, and an X-ray absorber pattern formed on the X-ray transmission film for absorbing the X-rays, wherein said X-ray absorber pattern comprises a material containing tantalum, boron, nitrogen and/or oxygen.

6. The X-ray mask blank as set forth in claim 1, wherein a proportional ratio of the tantalum, boron and nitrogen is in a range of 65 to 80 atomic %, 5 to 18 atomic % and 2 to 25 atomic %.

7. The X-ray mask blank as set forth in claim 2, wherein a proportional ratio of the tantalum, boron and oxygen is in a range of 65 to 80 atomic %, 5 to 18 atomic % and 2 to 25 atomic %.

8. The X-ray mask blank as set forth in claim 3, wherein a proportional ratio of the tantalum, boron, nitrogen and oxygen is in a range of 65 to 80 atomic %, 5 to 18 atomic %, 1 to 15 atomic % and 1 to 15 atomic %.

9. The X-ray mask as set forth in claim 5, wherein a proportional ratio of the tantalum, boron and nitrogen is in a range of 65 to 80 atomic %, 5 to 18 atomic % and 2 to 25 atomic %.

10. The X-ray mask as set forth in claim 5, wherein a proportional ratio of the tantalum, boron and oxygen is in a range of 65 to 80 atomic %, 5 to 18 atomic % and 2 to 25 atomic %.

11. The X-ray mask as set forth in claim 5, wherein a proportional ratio of the tantalum, boron, nitrogen and oxygen is in a range of 65 to 80 atomic %, 5 to 18 atomic %, 1 to 15 atomic % and 1 to 15 atomic %.

* * * * *